US011948655B2

(12) United States Patent
Eichmeyer et al.

(10) Patent No.: US 11,948,655 B2
(45) Date of Patent: Apr. 2, 2024

(54) INDICATING A BLOCKED REPAIR OPERATION

(71) Applicant: Micron Technology, Inc., Boise, ID (US)

(72) Inventors: Seth A. Eichmeyer, Boise, ID (US); Christopher G. Wieduwilt, Boise, ID (US); Matthew D. Jenkinson, Boise, ID (US); Matthew A. Prather, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 116 days.

(21) Appl. No.: 17/726,139

(22) Filed: Apr. 21, 2022

(65) Prior Publication Data

US 2023/0343409 A1     Oct. 26, 2023

(51) Int. Cl.
*H03K 19/20* (2006.01)
*G11C 29/00* (2006.01)
*G11C 29/18* (2006.01)
*G11C 29/44* (2006.01)

(52) U.S. Cl.
CPC .......... *G11C 29/4401* (2013.01); *G11C 29/18* (2013.01); *G11C 29/787* (2013.01); *H03K 19/20* (2013.01); *G11C 2029/4402* (2013.01)

(58) Field of Classification Search
CPC ... G11C 29/4401; G11C 29/18; G11C 29/787; G11C 2029/4402; H03K 19/20
USPC ........................................... 365/201
See application file for complete search history.

(56) References Cited

U.S. PATENT DOCUMENTS

| 6,223,255 | B1 * | 4/2001 | Argade | G06F 9/3001 |
| | | | | 712/E9.046 |
| 9,830,957 | B1 * | 11/2017 | Zhu | G11C 29/028 |
| 2005/0270863 | A1 * | 12/2005 | Kim | G11C 29/802 |
| | | | | 365/200 |
| 2009/0003098 | A1 * | 1/2009 | Hoess | G11C 29/883 |
| | | | | 365/200 |
| 2015/0339202 | A1 * | 11/2015 | Ware | G11C 29/88 |
| | | | | 714/6.2 |
| 2019/0095332 | A1 * | 3/2019 | Wang | G06F 12/0877 |

* cited by examiner

*Primary Examiner* — Ly D Pham
(74) *Attorney, Agent, or Firm* — Holland & Hart LLP

(57) ABSTRACT

Methods, systems, and devices for indicating a blocked repair operation are described. A first indication of whether an address of a memory device is valid may be stored. After the first indication is stored, a command for accessing the address may be processed. Based on processing the command, a second indication of whether the address is valid may be obtained, and a determination of whether to perform or prevent a repair operation for repairing the address may be made based on the first indication and the second indication. A third indication of whether the repair operation was performed or prevented may be stored.

20 Claims, 9 Drawing Sheets

INDICATING A BLOCKED REPAIR OPERATION

FIELD OF TECHNOLOGY

The following relates to one or more systems for memory, including systems for indicating a blocked repair operation.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
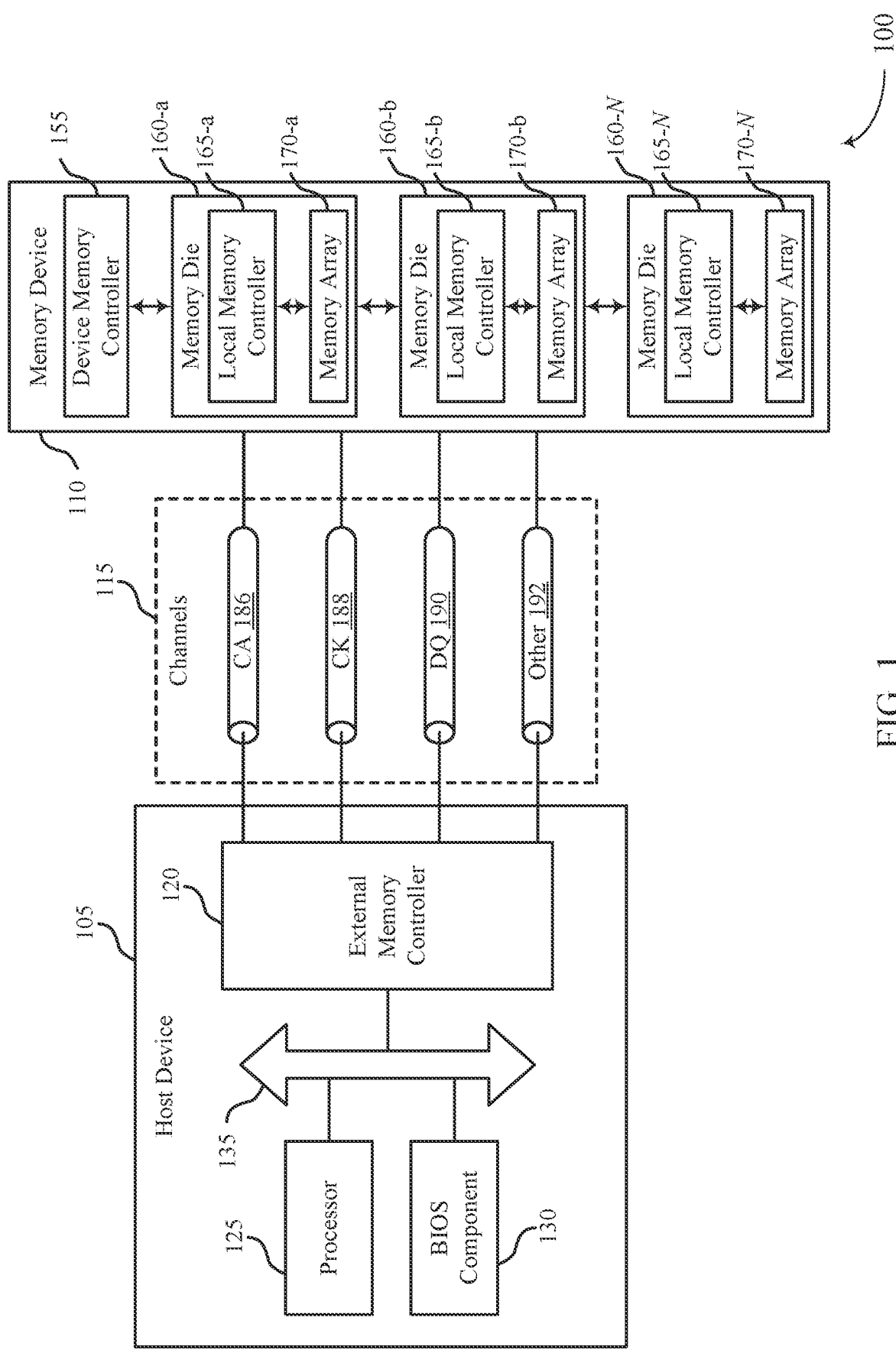
FIG. 1 illustrates an example of a system that supports indicating a blocked repair operation in accordance with examples as disclosed herein.

A memory device may include sets of one or more repair latches that are configured to store addresses that have been identified as invalid (e.g., during a pre-deployment testing process). A set of one or more repair latches may include one or more repair latches for indicating whether the set of repair latches is enabled (which may be referred to as an "enable latch") and one or more repair latches for indicating an invalid address (which may be referred to as "address latches"). During operation, if a command associated with an address that matches an address stored at a set of repair latches is received, the memory device may access a different address (which may be referred to as a redundant address) instead of the address. The operations for determining whether a received address matches an invalid address and for identifying a redundant address may be referred to as a repair operation.

An enable latch may, in some cases, inadvertently indicate that a corresponding set of repair latches is enabled despite the set of repair latches being unused by the memory device. In such cases, the address represented by the address latches of the set of unused repair latches may be incorrectly identified by a memory device as an invalid address e.g., if a command the address is processed at a memory device. Oftentimes, the invalid address indicated by the set of unused repair latches is based on default states of the unused repair latches. That is, if the set of unused repair latches have a default state corresponding to logic value 0, then the set of unused repair latches may indicate that address 0 is invalid. Accordingly, when a received, valid address matches the default address indicated by the set of unused repair latches is processed, the memory device may perform a repair operation that involves accessing memory cells at an erroneous repair address instead of the received address, resulting in storage failures, retrieval failures, or both.

To mitigate the effect of unused repair latches being inadvertently enabled, a determination of whether an address associated with a default state of a set of repair latches (which may be referred to as a "default address") has been repaired may be made. Based on the determination, a repair operation for a received address that matches the default address may be prevented from being performed (despite a set of repair addresses indicating the address is defective)—e.g., based on the determination indicating that the address has not been repaired. An indication of whether a repair operation has been prevented for a particular memory region (e.g., a memory bank), multiple memory regions, or both may be stored. The indication may be communicated to a host device e.g., in response to a request from the host device, a procedure performed at the memory device, or both. Based on the indication indicating that a repair operation has been prevented for one or more memory regions, a reinitialization procedure (which may include performing the fuse broadcast sequence) may be triggered at the memory device.

Features of the disclosure are initially described in the context of systems and dies. Features of the disclosure are also described in the context circuits and a process. These and other features of the disclosure are further illustrated by and described with reference to an apparatus diagram and flowcharts that relate to indicating a blocked repair operation.

FIG. 1 illustrates an example of a system 100 that supports indicating a blocked repair operation in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose CPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive information (e.g., data, commands, or both) from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include components (e.g., circuitry, logic) operable to control operation of the memory die 160. In some examples, a local memory controller 165 may be operable to communicate (e.g. receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or failing edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths (e.g., eight or nine signal paths) to communicate control information (e.g., commands or addresses).

In some examples, data channels 190 may be operable to communicate information (e.g., data, control information) between the host device 105 and the memory device 110, For example, the data channels 190 may communicate information (e.g., bi-directional) to be written to the memory device 110 or information read from the memory device 110.

A memory device 110 may store an indication of whether a particular address (e.g., address_0) of a memory device is valid (e.g., after a fuse broadcast sequence is completed). After the first indication is stored, the memory device 110 may process a command for accessing data stored at memory cells identified by a received address that is associated with the command. In some examples, the received address may correspond to the particular address. Based on processing the command, the memory device 110 may determine (independently of the first indication) whether the received address is valid—e.g., based on initiating a redundant match operation. The memory device 110 may generate an indication of whether the received address is valid based on a result of the redundant match operation. In some examples, a signal for triggering a repair operation for the received address may be generated if the memory device 110 determines that the received address is invalid as part of the redundant match operation.

Based on the stored indication of whether the received address is valid and the generated indication of whether the particular address is valid, the memory device 110 may determine whether to perform or prevent a repair operation for repairing the received address, Before determining whether to perform or prevent the repair operation, the memory device 110 may first determine whether the received address matches the particular address. If the received address is different than the particular address, the memory device 110 may permit the repair operation to proceed regardless of whether the stored indication indicates that the particular address is valid or invalid. Otherwise, if the received address matches the particular address and the generated indication indicates that a repair operation is to be performed, the memory device 110 may prevent the repair operation from proceeding based on the stored indication indicating that the particular address is valid. Based on preventing the repair operation, the memory device 110 may store an indication that the repair operation was prevented. Or if the received address matches the particular address and the generated indication indicates that a repair operation is to be performed, the memory device 110 may permit the repair operation to proceed based on the stored indication also indicating that the particular address is invalid.

Figure 2:
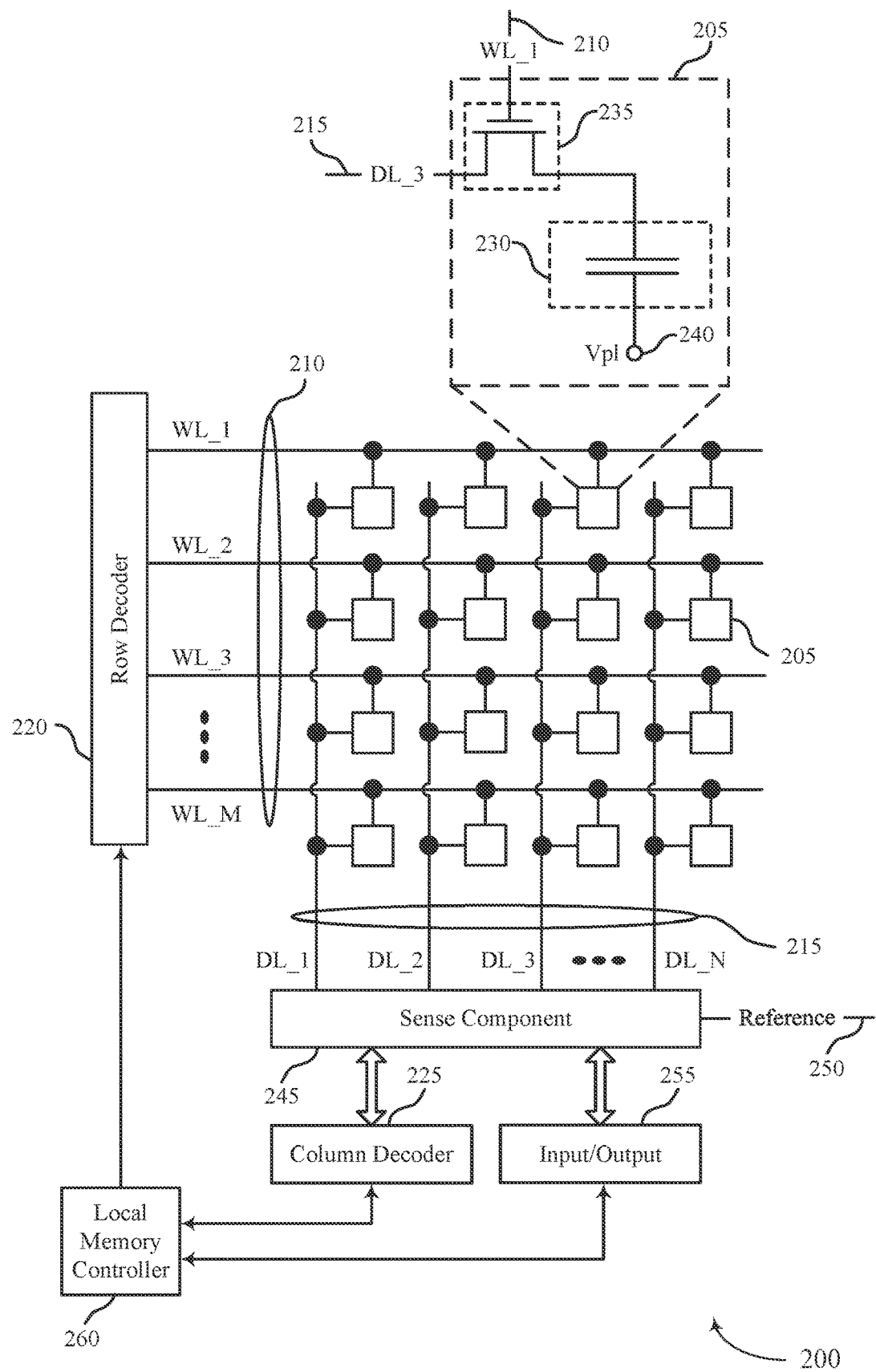
FIG. 2 illustrates an example of a memory die that supports indicating a blocked repair operation in accordance with examples as disclosed herein.

FIG. 2 illustrates an example of a memory die 200 that supports indicating a blocked repair operation in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include access lines (e.g., word lines 210 and digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or a combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device (e.g., a memory device 110) that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired state (e.g., logic state, charge state). The local memory controller 260 may identify a target memory cell 205 on which to perform the write operation. The local memory controller 260 may identify a target word line 210 and a target digit line 215 coupled with the target memory cell 205 (e.g., an address of the target memory cell 205). The local memory controller 260 may activate the target word line 210 and the target digit line 215 (e.g., applying a voltage to the word line 210 or digit line 215) to access the target memory cell 205. The local memory controller 260 may apply a signal (e.g., a write pulse, a write voltage) to the digit line 215 during the write operation to store a specific state (e.g., charge) in the capacitor 230 of the memory cell 205. The signal used as part of the write operation may include one or more voltage levels over a duration.

The local memory controller 260 may be operable to perform a read operation (e.g., a sense operation) on one or more memory cells 205 of the memory die 200. During a read operation, the state (e.g., logic state, charge state) stored in a memory cell 205 of the memory die 200 may be evaluated (e.g., read, determined, identified). The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal (e.g., charge, voltage) to the sense component 245 in response to biasing the access lines. The sense component 245 may amplify the signal. The local memory controller 260 may activate the sense component 245 (e.g., latch the sense component) and compare the signal received from the memory cell 205 to a reference (e.g., the reference 250). Based on that comparison, the sense component 245 may determine a logic state that is stored on the memory cell 205.

A local memory controller 260 may store an indication of whether a particular address (e.g., address_0) of a memory device is valid (e.g., after a fuse broadcast sequence is completed). After the first indication is stored, the local memory controller 260 may process a command for accessing data stored at memory cells identified by a received address that is associated with the command. In some examples, the received address may correspond to the particular address. Based on processing the command, the local memory controller 260 may determine (independently of the first indication) whether the received address is valid—e.g., based on initiating a redundant match operation. The local memory controller 260 may generate an indication of whether the received address is valid based on a result of the redundant match operation. In some examples, a signal for triggering a repair operation for the received address may be generated if the local memory controller 260 determines that the received address is invalid as part of the redundant match operation.

Based on the stored indication of whether the received address is valid and the generated indication of whether the particular address is valid, the local memory controller 260 may determine whether to perform or prevent a repair operation for repairing the received address. Before determining whether to perform or prevent the repair operation, the local memory controller 260 may first determine whether the received address matches the particular address. If the received address is different than the particular address, the local memory controller 260 may permit the repair operation to proceed regardless of whether the stored indication indicates that the particular address is valid or invalid. Otherwise, if the received address matches the particular address and the generated indication indicates that a repair operation is to be performed, the local memory controller 260 may prevent the repair operation from proceeding based on the stored indication indicating that the particular address is valid. Based on preventing the repair operation, the local memory controller 2660 may store an indication that the repair operation was prevented. Or if the received address matches the particular address and the generated indication indicates that a repair operation is to be performed, the local memory controller 260 may permit the repair operation to proceed based on the stored indication also indicating that the particular address is invalid.

Figure 3:
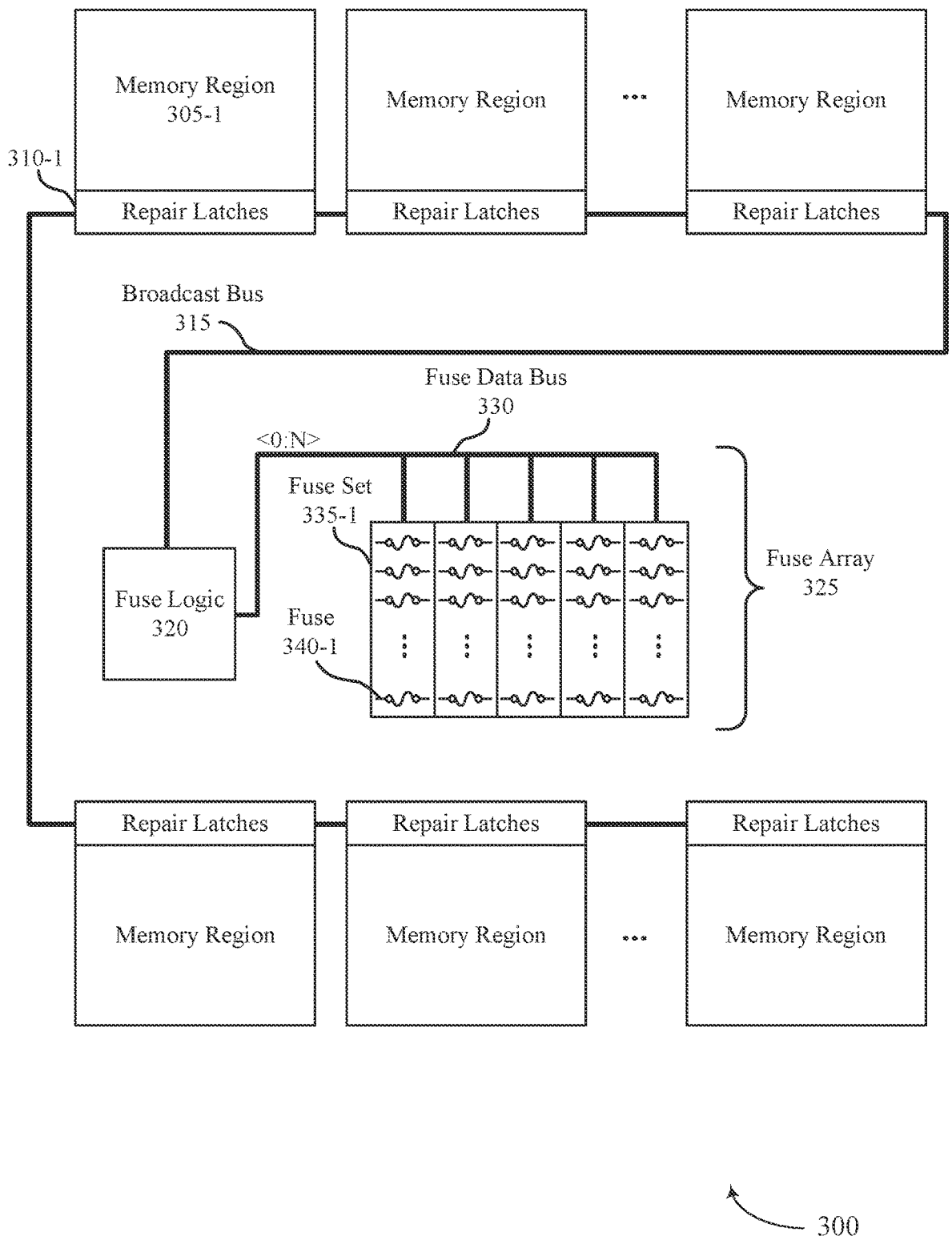
FIG. 3 illustrates an example of a subsystem that supports indicating a blocked repair operation in accordance with examples as disclosed herein.

FIG. 3 illustrates an example of a subsystem that supports indicating a blocked repair operation in accordance with examples as disclosed herein.

Subsystem 300 includes a set of memory regions (including first memory region 305-1), fuse array 325, and broadcast bus 315. A memory region may include one or more memory banks, a section of memory, one or more portions of a memory bank, a set of memory cells, a physical region of a memory device, or the like. In some examples, a memory device (e.g., memory device 110 of FIG. 1) may include subsystem 300. A memory array, such as the memory array described in FIG. 2, may include the memory regions.

The memory regions may each include sets of memory cells included in the memory array. Each memory region may be configured to store data (e.g., user data, error correction data, etc.). One or more of the memory regions (e.g., first memory region 305-1) may include or be coupled with a set of corresponding repair latches (e.g., first repair latches 310-1). The repair latches may be used to store invalid addresses of a corresponding memory region. For example, a set of repair latches may store an address that corresponds to a row of memory cells in a memory region that includes one or more defective memory cells, where defective memory cells may include memory cells that fail to store programmed logic states. As described herein, the terms "invalid address" and "defective address" may be used interchangeably. As described herein, a "set" may include one or more elements. If an address of a row of memory cells is stored in a set of repair latches, a memory device may be programmed to access, during a repair operation, a different row of memory cells (e.g., a repair or redundant row of memory cells) at an address that is different than a received address pointing to the invalid row of memory cells. By using repair latches, a percent of operational memory array yielded by a manufacturing process may be increased (e.g., because the memory arrays can be operations despite including one or more defective rows of memory cells).

A set of repair latches may store an enable bit and a set of address bits used to identify a defective address. In some examples, in a default state, the enable bit and the set of address bits in a set of repair latches may each represent a same logic value (e.g., a logic value 0 or a logic value 1). In some examples, each bit represented by a set of repair latches has a logic value 0—e.g., if a logic value 0 for the enable bit indicates the set of repair is unused. In some examples, each bit represented by a set of repair latches has a logic value 1—e.g., if a logic value 1 for the enable bit indicates the set of repair is unused. In yet other examples, each bit represented by a set of repair latches has a logic value 0—e.g., when a logic value 1 for the enable bit indicates the set of repair is unused—or vice versa.

Fuse array 325 may be configured to store information for operating a memory array (e.g., operating parameters). In some examples, the information for operating the memory array may be configured based on characteristics of the memory array—e.g., characteristics determined during testing. Fuse array 325 may store information indicating addresses in the memory array that are invalid and repair addresses for the invalid memory addresses. Fuse array 325 may also store information for modifying operating parameters (e.g., latencies, voltages, etc.) of the memory regions (e.g., individually, collectively, or both). Fuse array 325 may include fuse logic 320, repair fuse sets (including first repair fuse set 335-1), and fuse data bus 330.

Fuse logic 320 may be configured to broadcast, via broadcast bus 315, the information stored in fuse array 325 to the memory regions. Broadcasting the information may include passing a token between different components of the memory regions so that information stored in a fuse set can be stored in a corresponding latch at a memory region.

Repair fuse sets (e.g., first repair fuse set 335-1) may be configured to store operating information for the memory regions. In some examples, each repair fuse set may store an invalid address in a corresponding memory region. During a fuse broadcast operation (which may occur when a memory device is initialized), fuse logic 320 may retrieve, via fuse data bus 330, an invalid address stored in a repair fuse set (e.g., first repair fuse set 335-1) and broadcast the invalid address on broadcast bus 315 while a corresponding repair latch in a corresponding memory region (e.g., first memory region 305-1) is selected by the token.

Each repair fuse set may include a set of fuses (e.g., first repair fuse set 335-1 may include a set of fuses that includes first fuse 340-1). In some examples, a fuse may be semi-permanently set to a logic state. In other examples, a fuse may be permanently set to a logic state—e.g., by melting a filament between two contact.

After a fuse broadcast operation is complete, the repair latches at the memory regions may store the invalid addresses stored by the corresponding fuse sets. In some examples, not all of the repair latches at the memory regions are used. For example, a set of repair latches may go unused after the fuse broadcast operation is completed. A set of unused repair latches may each store a common default value (e.g., a logic value 0 or a logic value 1). In such cases, a repair latch of the set of unused repair latches storing an enable bit may store a logic value that indicates that the repair latch is unused (e.g., a logic value 0) and repair latches of the set of unused repair latches for storing address bits may store a default logic value (e.g., logic value 0). Accordingly, the repair latches of the set of unused repair latches for storing address bits may represent a default address (e.g., address 0 if all of the repair latches store logic value 0).

A repair latch storing an enable bit of a set of unused repair latches may inadvertently indicate that the set of unused repair latches is enabled. In some examples, after a fuse broadcast procedure is completed, a random event (e.g., a neutron strike) may change the enable bit from a first logic value (e.g., logic value 0) to a second logic value (e.g., logic value 1) that indicates the set of unused repair latches is enabled. In some examples, the enable bit may be incorrectly set to the second logic value during a fuse broadcast procedure (e.g., due to interference, a temporary component failure, a faulty fuse, etc.). In such cases, the address represented by the set of unused repair latches may be incorrectly identified by a memory device as an invalid address—e.g., if a command associated with the address is processed at a memory device. Oftentimes, the invalid address indicated by the set of unused repair latches is based on the default states of the unused repair latches. That is, if the set of unused repair latches have a default state corresponding to logic value 0, then the set of unused repair latches may indicate that address 0 is invalid. Accordingly, when a command associated with the address indicated by the set of unused repair latches is processed, the memory device may perform a repair operation associated with accessing memory cells at an erroneous repair address instead of the processed address, resulting in storage failures, retrieval failures, or both.

To mitigate the effect of unused repair latches being inadvertently enabled, a determination of whether an address associated with a default state of a set of repair latches (which may be referred to as a "default address") has been repaired may be made (e.g., based on an explicit indicator). Based on the determination, a repair operation for the address may be prevented from being performed (despite a set of repair addresses indicating the address is defective)—e.g., based on the determination indicating that the address has not been repaired. An indication of whether a repair operation has been prevented for a particular memory region, multiple memory regions, or both may be stored. The indication of whether the repair operation has been prevented may be communicated, for example, to a host device—e.g., in response to a request from the host device, a procedure performed at the memory device, or both. Based on the indication indicating that a repair operation has been prevented for one or more memory regions, a reinitialization procedure (which may include performing the fuse broadcast sequence) may be triggered at the memory device.

In some examples, a memory device may receive a command to access a set of memory cells at an address in first memory region 305-1, where one or more sets of repair latches in first memory region 305-1 may be unused. In some examples, the address may correspond to an address represented by a default state of the one or more sets of unused repair latches—e.g., the address may be address_0. Also, an enable bit of a set of unused repair latches in first memory region 305-1 may be inadvertently disturbed such that the enable bit indicates that the set of unused repair latches is indicated as being enabled.

Based on receiving the address, the memory device may determine that the received address is invalid based on the set of unused repair latches being inadvertently enabled. Also, based on receiving the address, the memory device may determine whether the received address corresponds to the default address and whether the default address is indicated as being repaired. Based on determining that the default address has not been repaired, the memory device may prevent the repair operation from being performed, and the memory device may proceed to access the memory cells at the received address, preventing a data error from occurring. Based on preventing the repair operation, a latch or register (which may be referred to as a "Block Match latch") at first memory region 305-1 may be programmed to store an indication (a "Block Match indication") that a repair operation was prevented within first memory region 305-1. Each memory region may similarly store a Block Match indication of whether a repair operation was prevented within a respective memory region. In some examples, the Block Match indications of the memory regions may be combined and stored in a latch or register (which may be referred to as a "All Block Match latch") to indicate whether a repair operation has been prevented in any of the memory regions.

In some examples, the Block Match indicators, the All Block Match indicator, or both may be signaled to a host device. For example, the memory device may signal a requested indicator based on a request received from a host device for the memory stored in one of the Block Match latches or the Block Match latch. In another example, the memory device may signal the Block Match Indicator, Block Match indicator, or both, to a host device based on completing a maintenance procedure—e.g., a scrubbing procedure used to identify memory cells storing improper data. Based on receiving the one or more indicators, a host device may instruct the memory device to perform a reinitialization process—e.g., based on the indicators indicated that one or more repair operations have been prevented.

By making an indication of whether a repair operation has been prevented accessible to a host device, a host device may use the indication to diagnose an issue being experienced and take corrective action—e.g., before a second disturbance causes an uncorrectable error in a set of unused repair latches.

Figure 4:
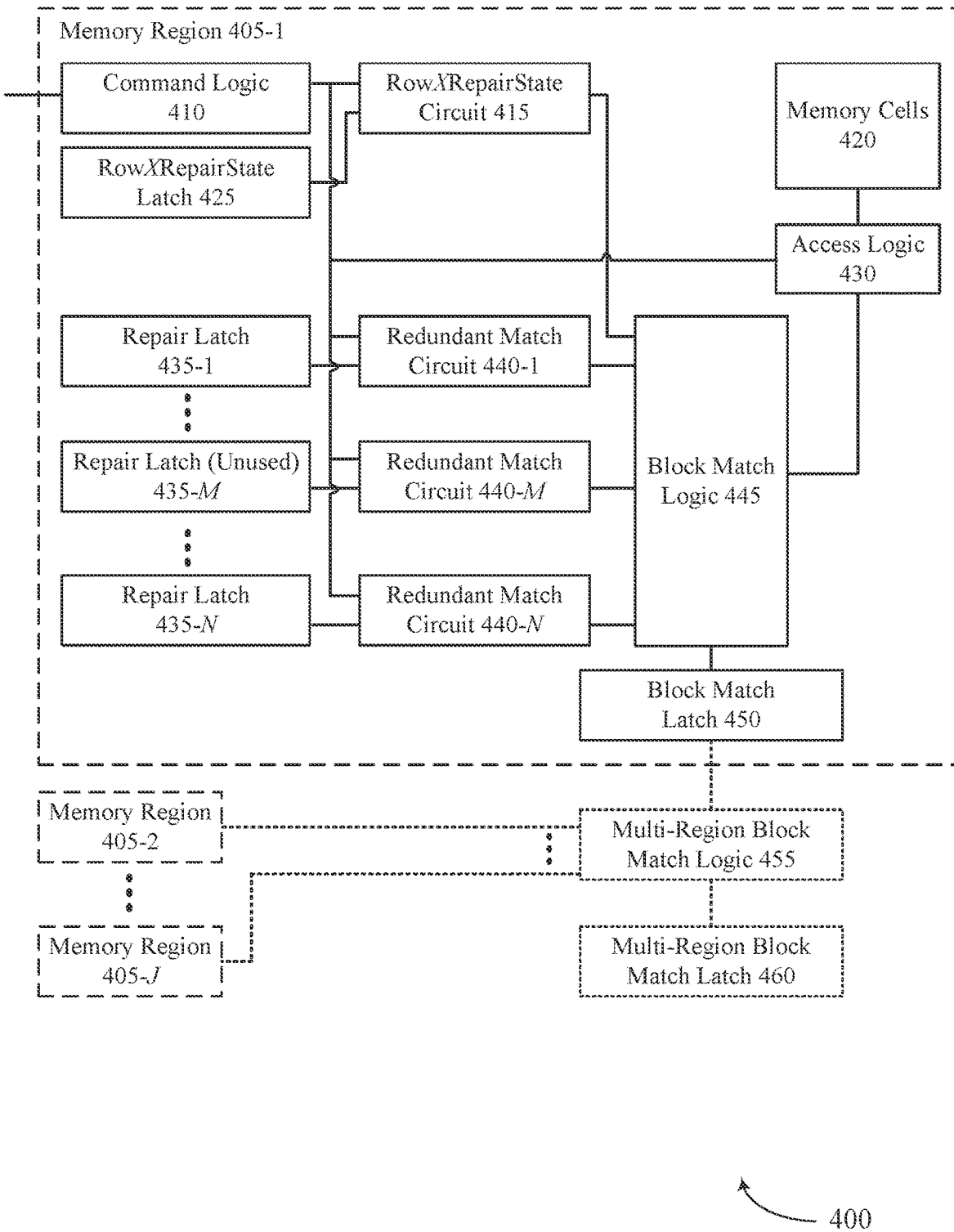
FIG. 4 through 6 illustrate examples of circuits that support indicating a blocked repair operation in accordance with examples as disclosed herein.

FIG. 4 illustrates an example of a circuit that supports indicating a blocked repair operation in accordance with examples as disclosed herein.

Subsystem 400 depicts components in first memory region 405-1 that is configured to identify inadvertently enabled repair latches; to prevent repair operations triggered by the inadvertently enabled repair latches; and to indicate the prevention of repair operations. Subsystem 400 may include memory regions (including first memory region 405-1), which may be examples of a memory region described herein including with reference to FIG. 3. Subsystem 400 may also include Multi-Region Block Match logic 455 and Multi-Region Block Match latch 460.

First memory region 405-1 may include command logic 410, RowXRepairState latch 425, first repair latch 435-1 through Nth repair latch 435-N, RowXRepairState circuit 415, first redundant match circuit 440-1 through Nth redundant match circuit 440-N, Block Match logic 445, Block Match latch 450, access logic 430, and memory cells 420.

Command logic 410 may be configured to process commands (e.g., read or write commands) received at first memory region 405-1. Command logic 410 may be configured to obtain an address associated with the processed commands and to provide the address to other components within first memory region 405-1.

RowXRepairState latch 425 may be configured to store an indication of whether row X (which may also be referred to as address X) is invalid. That is, RowXRepairState latch 425 may be configured to indicate whether row X has been repaired. The value of X may correspond to an address represented by the default values of unused repair latches. For example, if the unused repair latches represent the logic value 0 while in a default state, the value of X may correspond to address_0 of first memory region 405-1. Alternatively, if the unused repair latches represent the logic value 1 while in a default state, the value of X may correspond to the highest address of first memory region 405-1.

In some examples, a fuse may be programmed to store the indication of whether row X is repaired—based on validation testing that is performed prior to deployment. In such cases, the value of RowXRepairState latch 425 may be programmed during a fuse broadcast sequence. In some examples, RowXRepairState latch 425 may be programmed during operation based on a memory device detecting that the corresponding address is invalid.

The repair latches may be configured to indicate one or more defective memory addresses within first memory region 405-1. In some examples, fuse sets may be programmed to store the defective memory addresses and the repair latches may be respectively programmed to indicate defective memory address during a fuse broadcast sequence. Based on completing the fuse broadcast sequence, one or more of the repair latches (e.g., Mth repair latch 435-M) may be unused. In such cases, an enable bit of the unused repair latches may represent a default logic value (e.g., logic value 0) indicating that the repair latches are unused and address bits of the unused repair latches may also represent the default logic value, and thus a default address (e.g., row address_0).

RowXRepairState circuit 415 may be configured to determine whether an address obtained by command logic 410 matches row X as well as to determine whether row X is repaired based on RowXRepairState latch 425. If the obtained address matches row X and RowXRepairState latch 425 indicates that row X is repaired, RowXRepairState circuit 415 may be configured to output a signal for preventing any repair operations that may be triggered by the repair latches from being performed for row X. Components of RowXRepairState circuit 415 are described in more detail herein, including with reference to FIG. 5A.

The redundant match circuits 440 may be configured to determine whether an address obtained at command logic 410 has been indicated as an invalid address by a repair latch 435. The redundant match circuits 440 may be further configured to output an indication of whether the obtained address is an invalid address. Components of a redundant match circuit are described in more detail herein, including with reference to FIG. 5B. In some examples, the redundant match circuits are implemented as a single redundant match circuit—e.g., that is used for each of the repair latches.

Block Match logic 445 may be configured to determine whether to prevent a signal (which may be referred to as a "repair signal") output by a corresponding redundant match circuit to trigger a repair operation from reaching access logic 430. Block Match logic 445 may be configured to determine whether to prevent the repair signal based on an output of RowXRepairState circuit 415. For example, Block Match logic 445 may be configured to prevent the repair signal based on the RowXRepairState circuit 415 indicating that the obtained address matches the address of row X and that row X is not repaired. In some examples, RowXRepairState circuit 415 outputs logic value 1 to indicate that the obtained address matches the address of row X and that row X is not repaired. Alternatively, Block Match logic 445 may be configured to allow the repair signal based on the RowXRepairState circuit 415 indicating that the obtained address is different than the address of row X, that row X is repaired, or both.

Block Match logic 445 may be further configured to provide an indication, to Block Match latch 450, that a repair operation was prevented. In some examples, Block Match logic 445 may output a logic value 1 to indicate that the repair operation was prevented—e.g., when both RowXRepairState circuit 415 and a redundant match circuit output a logic value 1. In some examples, Block Match logic 445 includes an AND gate that receives the output of RowXRepairState circuit 415 and a combined output of the redundant match circuits and that outputs a logic value 1 when RowXRepairState circuit 415 indicates that row X is not repaired and the redundant match circuits indicate a repair operation for row X.

Block Match logic 445 may be further configured to provide a signal to access logic 430 that indicates whether a repair operation is to be performed based on the output of RowXRepairState circuit 415 and the outputs of the redundant match circuits. If RowXRepairState circuit 415 outputs a non-blocking output, Block Match logic 445 may pass the output of the redundant match circuits to access logic 430. That is, if one of the redundant match circuits indicates that the obtained address is to be repaired, Block Match logic 445 may output a signal to access logic 430 that triggers access logic 430 to access memory cells 420 at a redundant address instead of the obtained address, i.e., to perform a repair operation. Otherwise, if none of the redundant match circuits indicate that the obtained address is to be repaired, Block Match logic 445 may output a signal to access logic 430 that triggers access logic 430 to perform access memory cells 420 at the obtained address. Alternatively, if RowXRepairState circuit 415 outputs a blocking output, Block Match logic 445 may output a signal to access logic 430 that triggers access logic 430 to access memory cells 420 at the obtained address—regardless of the signals output by the redundant match circuits.

Block Match latch 450 may be configured to store an indication of whether a repair operation was prevented by Block Match logic 445—e.g., based on an output of Block Match logic 445.

Second memory region 405-2 through Jth memory region 405-J may be configured similar to first memory region 405-1—e.g., the memory region may include similar components as first memory region 405-1. For example, second memory region 405-2 through Jth memory region 405-J may include circuitry for preventing a repair operation and for recording when a repair operation is prevented.

Multi-Region Block Match logic 455 may be configured to obtain indications of whether a repair operation has been prevented from being performed in any of the memory regions 405. Multi-Region Block Match logic 455 may be further configured to determine whether a repair operation has been prevented in any of the memory regions. In some examples, Multi-Region Block Match logic 455 may include or be a multi-input OR gate that indicates a repair operation was prevented if any of the obtained indications indicate that a repair operation was prevented. Multi-Region Block Match logic 455 may output, to Multi-Region Block Match latch 460, a signal indicating whether a repair operation has been prevented in any of the memory regions.

Multi-Region Block Match latch 460 may be configured to store an indication of whether a repair operation has been prevented in any of the memory regions 405—e.g., based on the signal received from Multi-Region Block Match logic 455. In some examples, a memory device may retrieve the indication stored in Multi-Region Block Match latch 460—e.g., in response to a request from a host device or as part of an internal procedure.

Figure 5A:
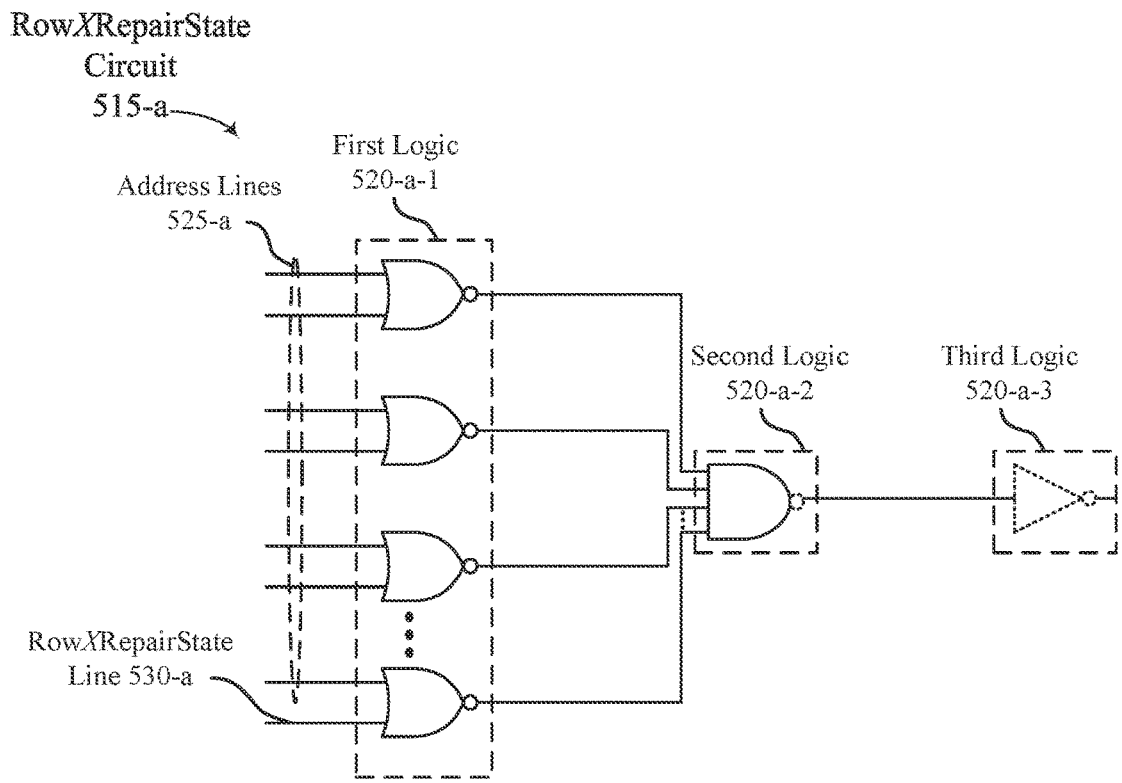

FIG. 5A illustrates an example of a circuit that supports indicating a blocked repair operation in accordance with examples as disclosed herein.

RowXRepairState circuit 515-*a* is configured to determine whether an obtained address matches a default address (e.g., address_0) represented by a set of unused repair latches. RowXRepairState circuit 515-*a* is further configured to determine whether the default address has been repaired. RowXRepairState circuit 515-*a* may output a signal indicating whether the obtained address matches the default address and whether the default address has been repaired. In some examples, the signal output by RowXRepairState circuit 515-*a* may prevent a repair operation based on the obtained address matching the default address and the default address not being repaired. In some examples, the signal output by RowXRepairState circuit 515-*a* may allow a repair operation based on the obtained address being different than the default address, the default address being repaired, or both.

First logic 520-*a*-1 may be configured to determine whether an obtained address matches a default address (e.g., address_0) based on applying NOR operations to different bits of the obtained address (e.g., via address lines 525-*a*). First logic 520-*a*-1 may include a set of NOR gates, where it may be determined that an obtained address matches the default address if each of the NOR gates outputs a logic value 0—e.g., if the default address is address_0. Accordingly, when the obtained address is address_0, the NOR gates used to compare the bits of the address may output logic value 1s.

First logic 520-*a*-1 may also be configured to determine whether the default address has been repaired. In some examples, a last NOR gate of first logic 520-*a*-1 may be configured to compare a bit (e.g., an LSB or MSB) of the obtained address with an indication of a the repair state for row X that is received via RowXRepairState line 530-*a*. In some examples, row X may correspond to the default address—e.g., row X may correspond to row 0. The signal for indicating the RowXRepairState may indicate a logic value 0 when row X has been repaired and a logic value 1 when row X is not repaired. Accordingly, when row X is repaired and the obtained address is address_0, the NOR gate may output a logic value 1.

Second logic 520-*a*-2 may be configured to output an indication of whether the obtained address matches the default address and default address has been repaired. For example, second logic 520-*a*-2 may output a signal indicating that the obtained address matches the default address and the default address has been repaired if each signal obtained from first logic 520-*a*-1 represents a logic value 1—the output signal may represent a logic value 0. Otherwise, second logic 520-*a*-2 may output a signal indicating that the obtained address is different than the default address, the default address is not repaired, or both, if any of the signals obtained from first logic 520-*a*-1 represents a logic value 0—the output signal may represent a logic value 1. In some examples, second logic 520-*a*-2 may include or be a NAND gate.

Third logic 520-*a*-3 may be used to invert the signal output by second logic 520-*a*-2. In some examples, third logic 520-*a*-3 is omitted from RowXRepairState circuit 515-*a*—e.g., if second logic 520-*a*-2 includes an multi-input AND gate instead of a NAND gate.

Figure 5B:
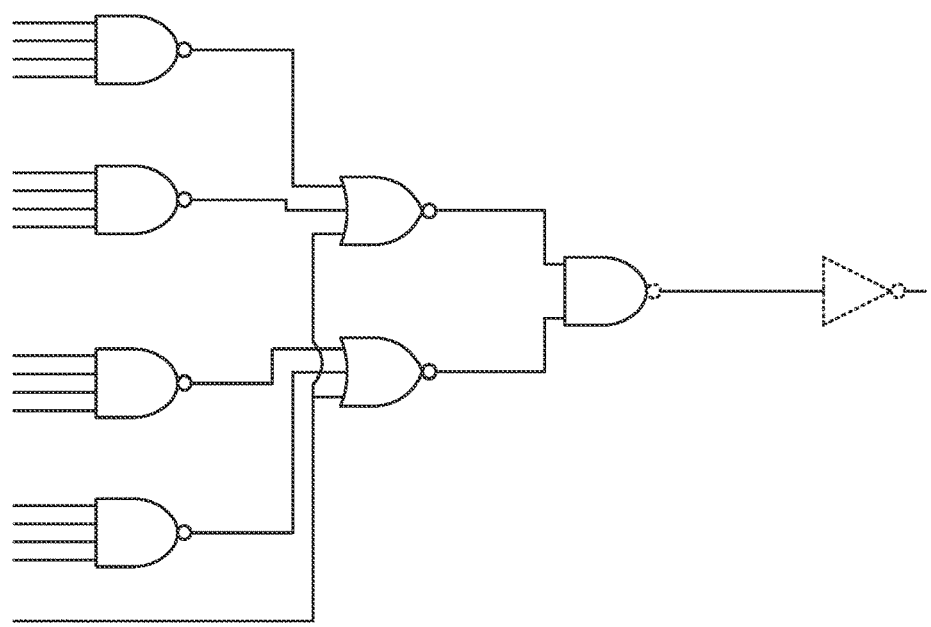

FIG. 5B illustrates an example of a circuit that supports indicating a blocked repair operation in accordance with examples as disclosed herein.

Redundant match circuit 540-*b* may be configured to determine whether an obtained address matches an address stored in a set of repair latches (e.g., an unused set of repair latches). Redundant match circuit 540-*b* may be further configured to output a signal indicating whether the obtained address matches the address stored in a set of repair latches. In some examples, a result of applying an XOR operation to the obtained address and the address stored in the set of repair latches is applied to redundant match circuit 540-*b*. In some examples, the XOR result of the obtained address with each address stored in the sets of repair latches may be applied to redundant match circuit 540-*b* (e.g., sequentially). In other examples, the XOR result of the obtained address with each address stored in the sets of repair latches may be applied to respective redundant match circuits that include redundant match circuit 540-*b*.

Figure 6:
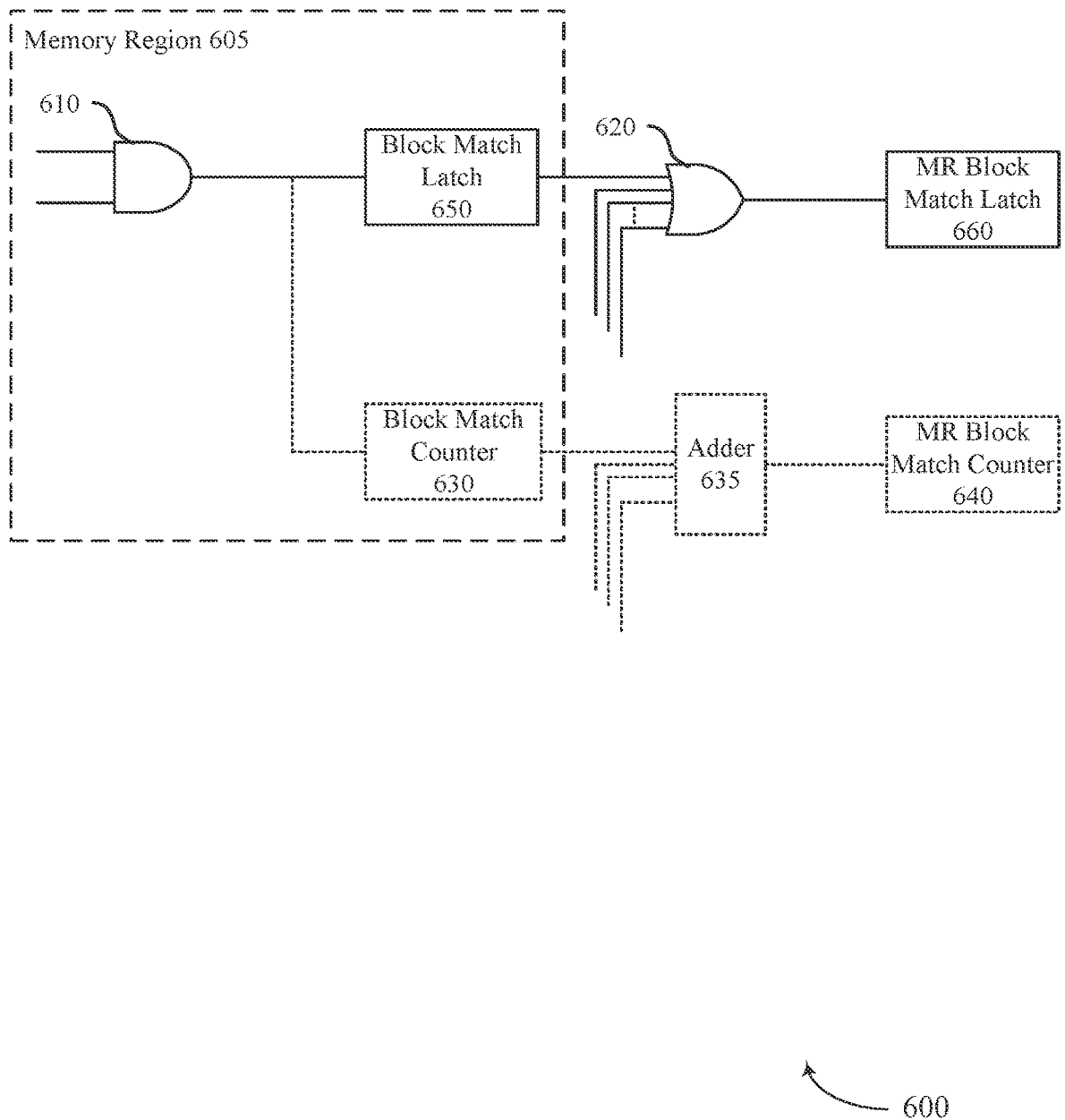

FIG. 6 illustrates an example of a circuit that supports indicating a blocked repair operation in accordance with examples as disclosed herein.

Repair indication circuit 600 may be configured to store an indication of whether a repair operation was prevented in a particular memory region or any memory region in a set of memory regions. Repair indication circuit 600 may be further configured to provide the indication in response to a request. In some examples, repair indication circuit 600 may also be configured to record a quantity of repair operations that have been prevented within a memory region or within a memory device (e.g., across a multiple memory regions).

Repair indication circuit 600 may include one or more components described with reference to FIG. 4, including Block Match logic 445, Block Match latch 450, Multi-Region Block Match logic 455, and Multi-Region Block Match latch 460. For example, AND gate 610 may be or be included in Block Match logic 445, Block Match latch 650 may be an example of Block Match latch 450, OR gate 620 may be or be included in Multi-Region Block Match logic 455; and Multi-Region Block Match latch 660 may be an example of Multi-Region Block Match latch 460. Repair indication circuit 600 may further include Block Match counter 630, adder 635, and Multi-Region Block Match counter 640.

AND gate 610 may be configured to apply an AND operation to a signal output by a RowXRepairState circuit and to a signal output by a redundant match circuit. If the signal output by the RowXRepairState circuit indicates that a row X is not repaired and the signal output by the redundant match circuit indicates that row X is to be repaired, AND gate 610 may output a signal indicating that a repair operation was prevented for memory region 605.

Block Match latch 650 may be configured to store an indication that a repair operation was prevented at memory region 605 if AND gate 610 outputs a signal indicating that a repair operation was prevented for memory region 605. In some examples, after storing an indication that a repair operation was prevented, Block Match latch 650 may continue to store the indication until a reset operation or reinitialization operation is performed for Block Match latch 650 or memory region 605.

Block Match counter 630 may be configured to record a quantity of repair operations that have been prevented for memory region 605—e.g., since an initialization procedure was performed. Block Match counter 630 may be reset when an reset operation or reinitialization operation for Block Match counter 630 or memory region 605.

OR gate 620 may be configured to receive, from Block Match latch 650 an indication of whether a repair operation has been prevented for memory region 605. OR gate 620 may be further configured to receive from Block Match latches at other memory regions, whether repair operations have been prevented for the other memory regions. OR gate 620 may be configured to output an indication of whether a repair operation has been prevented at any memory regions coupled with OR gate 620. For example, OR gate 620 may output a signal indicating that a repair operation has been prevented within at least one of the memory regions based on a Block Match latch of at least of the memory regions indicating that a repair operation has been prevented.

Multi-Region Block Match latch 660 may be configured to store an indication that a repair operation was prevented at least one of the memory regions if OR gate 620 outputs a signal indicating that a repair operation was prevented within at least one of the memory regions. In some examples, after storing an indication that a repair operation was prevented within at least one of the memory regions, Multi-Region Block Match latch 660 may continue to store the indication until a reset operation or reinitialization operation is performed for Multi-Region Block Match latch 660 or the memory device.

Adder 635 may be configured to add the quantities of repair operations prevented at different memory regions of a set of multiple memory regions that include memory region 605. Adder 635 may be further configured to output a summation of the quantities to Multi-Region Block Match counter 640.

Multi-Region Block Match counter 640 may be configured to store a total quantity of repair operations prevented at the set of multiple memory regions.

Figure 7:
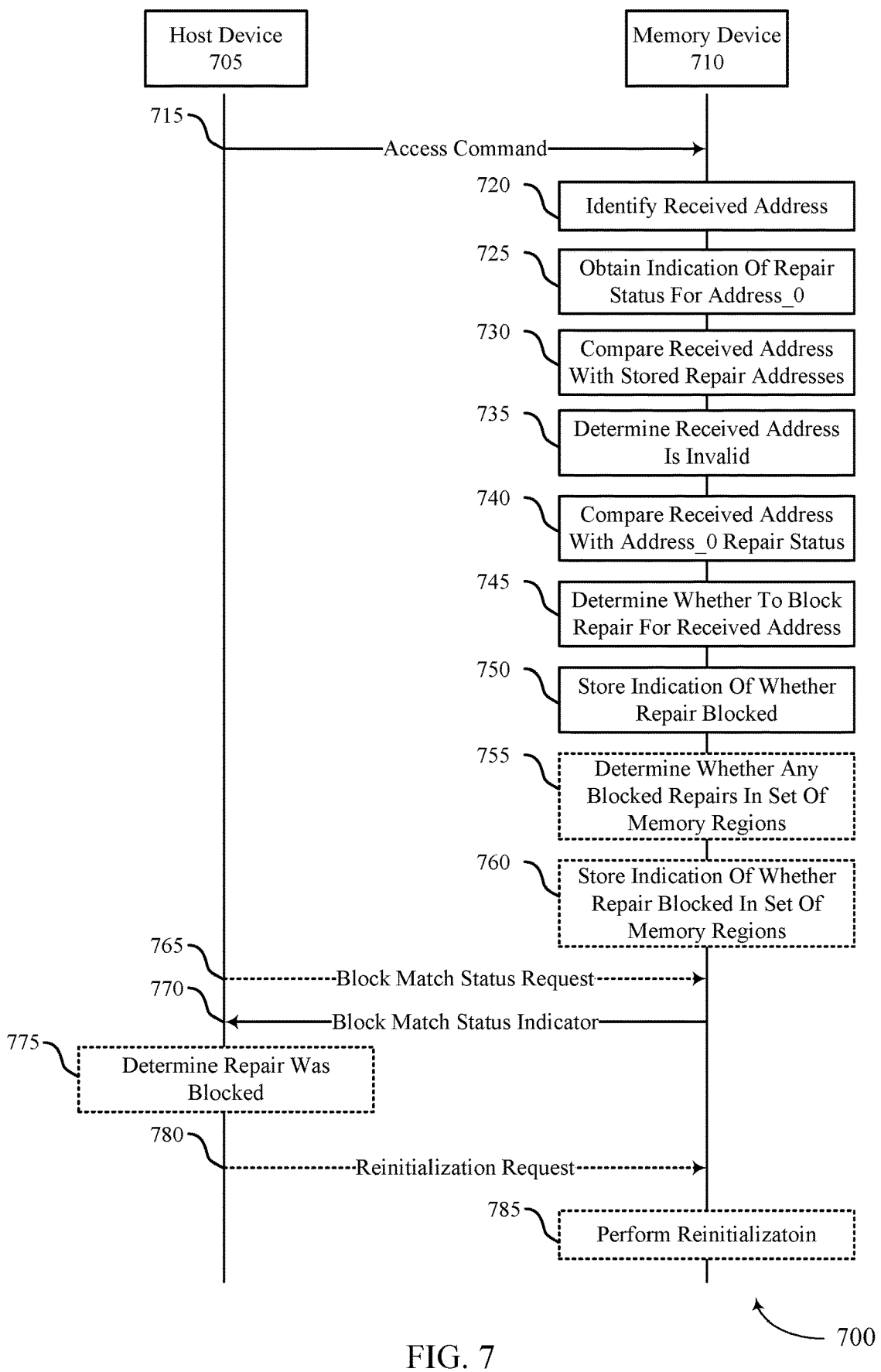
FIG. 7 illustrates an example of a set of operations that supports indicating a blocked repair operation in accordance with examples as disclosed herein.

FIG. 7 illustrates an example of a set of operations that support indicating a blocked repair operation in accordance with examples as disclosed herein.

Process flow 700 may be performed by host device 705 and memory device 710, which may be respective examples of a host device and a memory device described herein. In some examples, process flow 700 illustrates an example set of operations performed to support indicating a blocked repair operation. For example, process flow 700 may include operations for storing and signaling an indication of whether a repair operation has been prevented in a memory device.

Aspects of the process flow 700 may be implemented by a controller, among other components. Additionally, or alternatively, aspects of the process flow 700 may be implemented as instructions stored in memory (e.g., firmware stored in a memory coupled with a controller). For example, the instructions, when executed by a controller (e.g., a controller at memory device 710), may cause the controller to perform the operations of the process flow 700.

One or more of the operations described in process flow 700 may be performed earlier or later, omitted, replaced, supplemented, or combined with another operation. Also, additional operations described herein may replace, supplement or be combined with one or more of the operations described in process flow 700.

At 715, an access command (e.g., a read command or write command) may be transmitted (e.g., by host device 705) to memory device 710. The access command may include an indication of the type of command and an address for the command. In some examples, the type of command and address information may be transmitted using a common or separate buses.

At 720, the received address may be identified (e.g., by memory device 710). For example, memory device 710 may decode the received address based on signaling captured on an address bus that corresponds to the command. The received address may be provided to other components within memory device 710, such as a RowXRepairState circuit, a redundant match circuit, or both. In some examples, the received address may correspond to a default address of a memory region stored by unused sets of repair latches (e.g., address_0 in a memory region).

At 725, an indication of a repair status for address_0 may be obtained (e.g., by a Row0RepairState circuit within memory device 710)—e.g., based on the access command being received. The repair status for address_0 may be stored in a Row0RepairState latch and may indicate whether address_0 is repaired. In some examples, the indication of whether address_0 is repaired may be stored in the Row0RepairState latch during an initialization procedure (e.g., which may include a fuse broadcast sequence).

At 730, the received address may be compared (e.g., by memory device 710) with one or more repair addresses stored in one or more repair latches. In some examples, the received address and the stored repair address are compared using a redundant match circuit.

At 735, the received address may be determined (e.g., by memory device 710) as an invalid address—e.g., based on an output of the redundant match circuit. The received address may be determined as an invalid address based on the received address matching at least one of the stored addresses in a set of repair latches. In some examples, the received address is identified as matching an address stored in a set of unused repair latches based on an enable bit of the set of unused repair latches being inadvertently set. Accordingly, a signal (e.g., a redundant match signal) for triggering a repair operation may be generated.

The enable bit of the set of unused repair latches may be inadvertently set during an initialization procedure—e.g., due to an intermittent or permanent error in a fuse broadcast sequence, interference during a fuse broadcast sequence, a defective fuse, a defective latch, etc. Additionally, or alternatively, the enable bit of the set of unused repair latches may be inadvertently set by a disturbance that occurs during operation—e.g., a neutron strike, interference, etc.

At 740, the received address may be compared with the repair status for address_0. In some examples, a repair status for address_0 may be determined—e.g., based on the repair status indicator. Separately, or as part of determining the repair status for address_0, a determination of whether the received address matches address_0 may be made. In some examples, the determination of whether the received address matches address_0 and a determination of whether address_0 is repaired may be accomplished based on comparing bits of the received address with one another as well as comparing a bit (e.g., a MSB or LSB) of the received address with the repair status for address_0—e.g., as described with reference to FIG. 5A.

At 745, whether to prevent a repair operation for the received address may be determined—e.g., based on identifying index of the received address and determining the repair status of address_0. In such cases, if the received address corresponds to address_0 (e.g., each bit of the received address represented logic value 0) and the repair status indicator indicates that address_0 has not been repaired (e.g., the repair status indicator represented logic value 0), a signal for preventing a repair operation for the received address may be generated. Otherwise, if the received address is different than address_0 or the repair status indicator indicates that address_0 has been repaired, a signal for allowing a repair operation to proceed may be generated.

In some examples, a repair operation at memory device 710 may be prevented—e.g., based on the received address corresponding to address_0, the redundant match operation erroneously indicating that the received address is invalid, and the repair status indicator indicating that address_0 is not repaired. In other examples, a repair operation at memory device 710 may be allowed to proceed—e.g., based on the repair status indicator indicating that the address_0 has been repaired, based on the received address corresponding to an address that is not address_0 and the redundant match operation indicating that the received address is invalid, or a combination thereof.

At 750, an indication of whether a repair operation was prevented within a memory region may be stored—e.g., in a Block Match latch. In some examples, once a Block Match latch is set, the Block Match latch will remain set until a reinitialization procedure is performed for memory device 710. In the event a repair operation is prevented within the memory region, the Block Match latch may be set to represent a logic value that indicates that a repair operation was prevented.

In some examples, Block Match logic in a memory region may keep track of a quantity of times a repair operation has been prevented in the memory region. The quantity of times a repair operation has been prevented in a memory region may be stored in the Block Match latch or in a different Block Match latch used to store the quantity.

At 755, a determination of whether any repair operations were prevented in any memory regions of a set (e.g., all) of memory regions in memory device 710 may be made. In some examples, each memory region may include a Block Match latch and may provide a logic value stored in the respective Block Match latches to logic (e.g., Multi-Region Match logic) that is configured to determine whether a repair operation has been prevented in any of the memory regions. In some examples, the Multi-Region Match logic includes an OR gate that indicates a logic value 1 if a repair operation is prevented in any one of the memory regions.

At 760, an indication of whether a repair operation was prevented within any of the memory regions of a set of memory regions may be stored—e.g., in a Multi-Region Block Match latch. In some examples, once a Multi-Region Block Match latch is set, the Multi-Region Block Match latch may remain set until a reinitialization procedure is performed for memory device 710. In the event a repair operation is prevented within any of the memory regions, the Multi-Region Block Match latch may be set to represent a logic value that indicates that a repair operation was prevented.

In some examples, Multi-Region Match logic may keep track of a quantity of times a repair operation has been prevented within the memory regions. The quantity of times a repair operation has been prevented in the memory region may be stored in the Multi-Region Block Match latch or in a different Multi-Region Block Match latch used to store the quantity.

At 765, a request to determine whether a repair operation has been prevented within memory device 710 may be received (e.g., from host device 705). In some examples, the request include a request to read the Multi-Region Block Match latch to determine whether a repair operation has been prevented within any of the memory regions. In some examples, the request include a request to read a particular Block Match latch to determine whether a repair operation has been prevented within a particular memory region (e.g., a memory region used to store critical data). In some examples, the request may include a request to determine a quantity of times a repair operation has been prevented within memory device 710. In some examples, the request may include a request to determine a quantity of times a repair operation has been prevented within a particular memory region of memory device 710.

In some examples, during an initial configuration stage, memory device 710 may indicate to host device 705 that memory device includes one or more registers for storing information related to whether repair operations at memory device 710 have been prevented from being performed. In some examples, host device 705 sends the Block Match Status request during a period of time when input/output activity at memory device 710 is below a threshold quantity—e.g., when not input/output activity is occurring. For example, host device 705 may send the Block Match Status request while a refresh operation is being performed at memory device 710.

At 770, an indication of whether a repair operation has been prevented within memory device 710 may be provided to host device 705. In some examples, the indication is provided to host device 705 in response to a request from host device 705. In other examples, the indication is provided to host device 705 based on the execution of a procedure (e.g., a scrubbing procedure used to identify memory cells storing erroneous data) at memory device 710.

In some examples, the indicator indicates that a repair operation has been prevented within at least one memory region of memory device 710. The indicator may also indicate a quantity of repair operations that have been prevented within memory device 710. In some examples, the indicator indicates that a repair operation has been prevented within a particular memory region. The indicator may also indicate a quantity of repair operations that have been prevented within a memory region of memory device 710. In some examples, the indicator indicates that no repair operations have been prevented.

At 775, a determination that a repair operation was prevented at memory device 710 may be made (e.g., by host device 705)—e.g., based on the Block Match Status indicator. In some examples, host device 705 may determine a quantity of repair operations prevented at memory device 710 based on the Block Match Status indicator. In some examples, host device 705 may determine that a repair operation was prevented at a particular memory region of memory device 710 based on the Block Match Status indicator. In some examples, host device 705 may determine a quantity of repair operations prevented at the particular memory region of memory device 710 based on the Block Match Status indicator.

At 780, a reinitialization request may be sent (e.g., by host device 705) to memory device 710—e.g., based on a content of the Block Match Status indicator. In some examples, host device 705 may transmit the reinitialization request based on the Block Match Status indicator indicating that at least one repair operation was prevented at memory device 710. In some examples, host device 705 may transmit the reinitialization request based on the Block Match Status indicator indicating that a threshold quantity of repair operation were prevented at memory device 710. In some examples, host device 705 may transmit the reinitialization request based on the Block Match Status indicator indicating that at least one repair operation was (or a threshold quantity of repair operations were) prevented at a particular memory region of memory device 710. In some examples, host device 705 may transmit the reinitialization request based on the Block Match Status indicator indicating that a threshold quantity of repair operation was prevented at any one particular memory region of memory device 710.

At 785, a reinitialization procedure may be performed at memory device 710. The reinitialization procedure may include clearing the information stored in the repair latches and triggering a fuse broadcast sequence to reload the repair latches. Performing a reinitialization procedure after detecting that a repair operation has been prevented (e.g., due to an enabled latch of a set of repair latches inadvertently indicating that the set of repair latches is enabled) may prevent an uncorrectable error from developing—e.g., if an address latch of the set of repair latches was subsequently disturbed, for example, by a neutron strike.

In some examples, after a reinitialization procedure is completed by memory device 710, host device 705 may again send a command with address_0 and subsequently request a Block Match Status indicator. If the Block Match Status indicator again indicates that a repair operation has been prevention, the host device 705 may determine that memory device 710 has a defect (e.g., in the fuse array, the fuse broadcast sequence, a repair latch, etc.). In some examples, host device 705 may repeat the above procedure a threshold quantity of times before concluding that memory device 710 is defective. In some cases, based on determining that memory device 710 is defective, host device 705 may continue to operate memory device 710 but may blacklist address_0, for example.

Although described in the context of address_0 of the memory regions, the above operations may similarly be performed for the highest address in the memory regions (that is, where all of the bits of address represent logic value 1). For example, if the default logic value stored by repair latches is logic value 1 and if a repair latch storing an enable bit indicates that a set of repair latches is unused by representing a logic value 1. Indeed, the above operation may similarly be performed for any address X—e.g., with corresponding adjustments to the RowXRepairState circuitry to support address that are between address_0 and the highest address.

Figure 8:
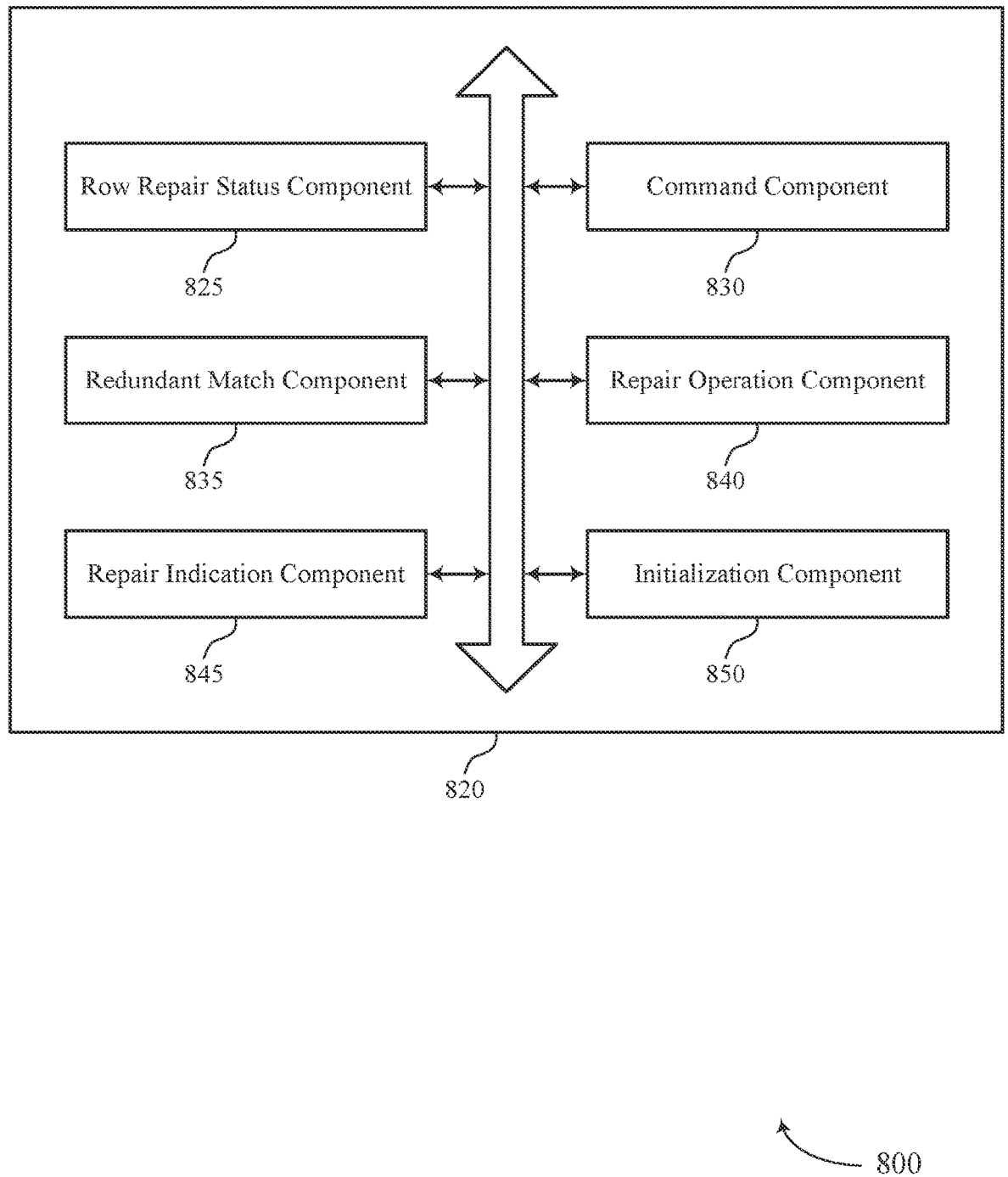
FIG. 8 shows a block diagram of a memory device that supports indicating a blocked repair operation in accordance with examples as disclosed herein.

FIG. 8 shows a block diagram 800 of a memory device 820 that supports indicating a blocked repair operation in accordance with examples as disclosed herein. The memory device 820 may be an example of aspects of a memory device as described with reference to FIGS. 1 through 7. The memory device 820, or various components thereof, may be an example of means for performing various aspects of indicating a blocked repair operation as described herein. For example, the memory device 820 may include a row repair status component 825, a command component 830, a redundant match component 835, a repair operation component 840, a repair indication component 845, an initialization component 850, or any combination thereof. Each of these components may communicate, directly or indirectly, with one another (e.g., via one or more buses).

The row repair status component 825 may be configured as or otherwise support a means for storing a first indication of whether an address of a memory device is valid. The command component 830 may be configured as or otherwise support a means for processing, after the first indication is stored, a command for accessing the address. The redundant match component 835 may be configured as or otherwise support a means for obtaining, based at least in part on processing the command, a second indication of whether the address is valid. The repair operation component 840 may be configured as or otherwise support a means for determining whether to perform or prevent a repair operation for repairing the address based at least in part on the first indication and the second indication. The repair indication component 845 may be configured as or otherwise support a means for storing, based at least in part on the determining, a third indication of whether the repair operation was performed or prevented.

In some examples, the command component 830 may be configured as or otherwise support a means for receiving, based at least in part on storing the third indication of whether the repair operation was performed or prevented, a request for the third indication of whether the repair operation was performed or prevented. In some examples, the repair indication component 845 may be configured as or otherwise support a means for transmitting, in response to the request, the third indication of whether the repair operation was performed or prevented.

In some examples, the initialization component 850 may be configured as or otherwise support a means for receiving a request to perform a reinitialization operation for reinitializing the memory device based at least in part on the third indication indicating that the repair operation was prevented. In some examples, the initialization component 850 may be configured as or otherwise support a means for performing the reinitialization operation in response to the request, where performing the reinitialization operation includes broadcasting, to a plurality of latches in the memory device, data stored in a plurality of fuses in the memory device.

In some examples, the address is associated with a memory bank of the memory device, the first indication of whether the address is valid is stored in a first latch of the memory bank, and the second indication of whether the address is valid is obtained based at least in part on a comparison of the address and values of a plurality of latches of the memory bank.

In some examples, obtaining the second indication of whether the address is valid comprises comparing a set of bits used to represent the address with values of a plurality of latches that are associated with the address, and the repair indication component 845 may be configured as or otherwise support a means for generating, based at least in part on processing the command, a fourth indication of whether to prevent the repair operation based at least in part on a comparison of the set of bits used to represent the address with the first indication of whether the address is valid.

In some examples, the repair indication component 845 may be configured as or otherwise support a means for applying, to an AND gate and based at least in part on the generating, the fourth indication of whether to prevent the repair operation and the second indication of whether the address is valid to obtain the third indication.

In some examples, the third indication of whether the repair operation was performed or prevented is associated with a memory bank of the memory device, and the repair indication component 845 may be configured as or otherwise support a means for applying, to an OR gate, the third indication of whether the repair operation was performed or prevented and a set of indications of whether the repair operation was performed or prevented that is associated with a set of memory banks to obtain a fifth indication of whether any repair operations have been prevented in any memory bank of the memory device.

In some examples, the repair indication component 845 may be configured as or otherwise support a means for storing the fifth indication of whether any repair operations have been prevented in any memory bank of the memory device. In some examples, the repair indication component 845 may be configured as or otherwise support a means for receiving, based at least in part on storing the fifth indication, a request for the fifth indication. In some examples, the repair indication component 845 may be configured as or otherwise support a means for transmitting the fifth indication in response to the request.

In some examples, the second indication of whether the address is valid indicates that the address is invalid, and the repair operation component 840 may be configured as or otherwise support a means for preventing the repair operation based at least in part on determining to prevent the repair operation from being performed, where the third indication of whether the repair operation was performed or prevented indicates that the repair operation was prevented based at least in part on the repair operation being prevented.

In some examples, determining whether to perform or prevent the repair operation comprises determining to perform the repair operation based at least in part on the first indication indicating that the address is invalid and the second indication indicating that the address is invalid, and the repair operation component 840 may be configured as or otherwise support a means for performing the repair operation based at least in part on determining to perform the repair operation, where the third indication of whether the repair operation was performed or prevented indicates that the repair operation was performed based at least in part on the repair operation being prevented.

In some examples, the third indication of whether the repair operation was performed or prevented is stored in a register.

In some examples, each bit of a set of bits used to represent the address has a same first value.

Figure 9:
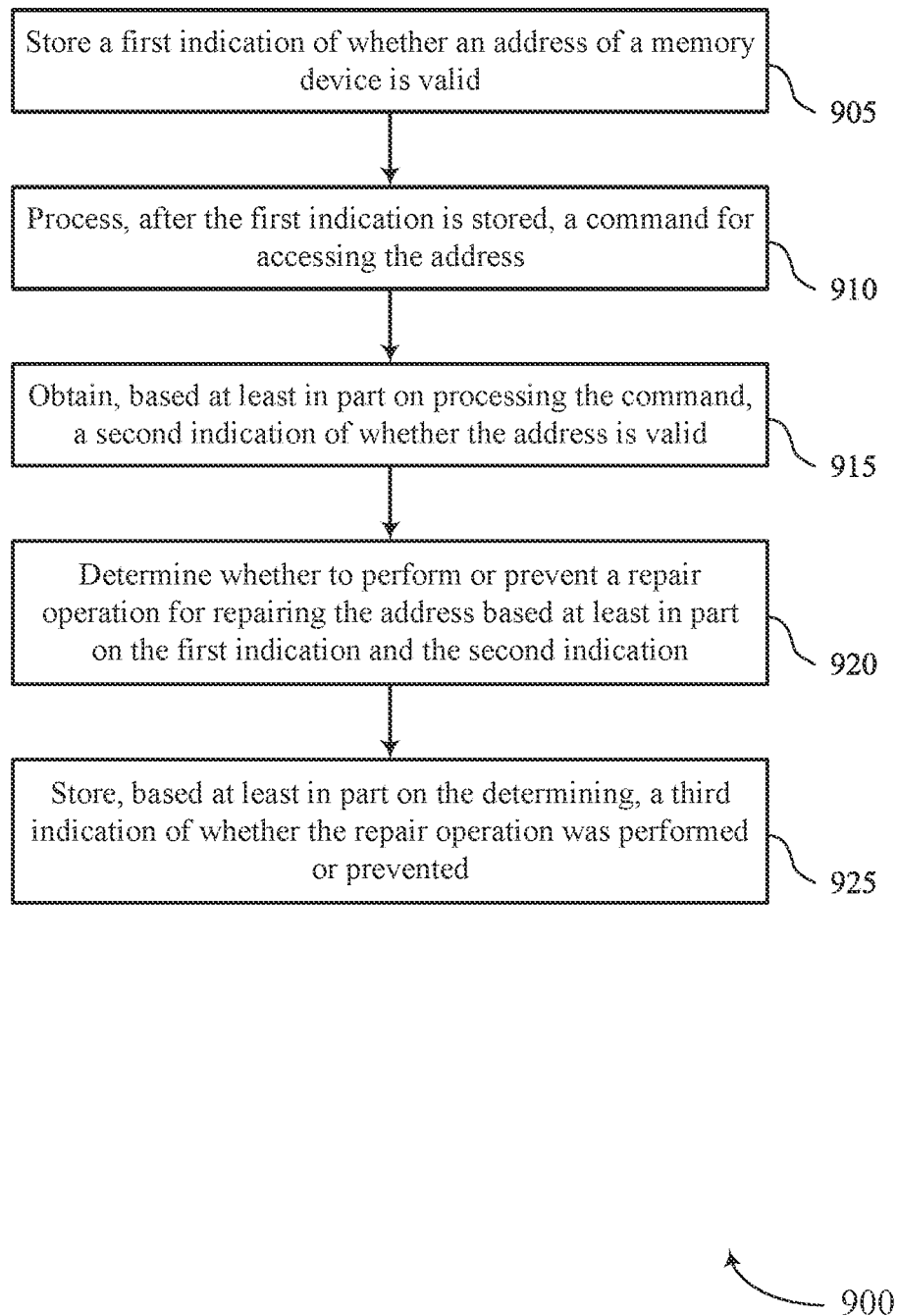
FIG. 9 shows a flowchart illustrating a method or methods that support indicating a blocked repair operation in accordance with examples as disclosed herein.

FIG. 9 shows a flowchart illustrating a method 900 that supports indicating a blocked repair operation in accordance with examples as disclosed herein. The operations of method 900 may be implemented by a memory device or its components as described herein. For example, the operations of method 900 may be performed by a memory device as described with reference to FIGS. 1 through 8. In some examples, a memory device may execute a set of instructions to control the functional elements of the device to perform the described functions. Additionally, or alternatively, the memory device may perform aspects of the described functions using special-purpose hardware.

At 905, the method may include storing a first indication of whether an address of a memory device is valid. The operations of 905 may be performed in accordance with examples as disclosed herein. In some examples, aspects of the operations of 905 may be performed by a row repair status component 825 as described with reference to FIG. 8.

At 910, the method may include processing, after the first indication is stored, a command for accessing the address. The operations of 910 may be performed in accordance with examples as disclosed herein. In some examples, aspects of the operations of 910 may be performed by a command component 830 as described with reference to FIG. 8.

At 915, the method may include obtaining, based at least in part on processing the command, a second indication of whether the address is valid. The operations of 915 may be performed in accordance with examples as disclosed herein. In some examples, aspects of the operations of 915 may be performed by a redundant match component 835 as described with reference to FIG. 8.

At 920, the method may include determining whether to perform or prevent a repair operation for repairing the address based at least in part on the first indication and the second indication. The operations of 920 may be performed in accordance with examples as disclosed herein. In some examples, aspects of the operations of 920 may be performed by a repair operation component 840 as described with reference to FIG. 8.

At 925, the method may include storing, based at least in part on the determining, a third indication of whether the repair operation was performed or prevented. The operations of 925 may be performed in accordance with examples as disclosed herein. In some examples, aspects of the operations of 925 may be performed by a repair indication component 845 as described with reference to FIG. 8.

In some examples, an apparatus as described herein may perform a method or methods, such as the method 900. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for storing a first indication of whether an address of a memory device is valid; processing, after the first indication is stored, a command for accessing the address; obtaining, based at least in part on processing the command, a second indication of whether the address is valid; determining whether to perform or prevent a repair operation for repairing the address based at least in part on the first indication and the second indication; and storing, based at least in part on the determining, a third indication of whether the repair operation was performed or prevented.

Aspect 2: The method, apparatus, or non-transitory computer-readable medium of aspect 1, further including operations, features, circuitry, logic, means, or instructions, or any combination thereof for receiving, based at least in part on storing the third indication of whether the repair operation was performed or prevented, a request for the third indication of whether the repair operation was performed or prevented and transmitting, in response to the request, the third indication of whether the repair operation was performed or prevented.

Aspect 3: The method, apparatus, or non-transitory computer-readable medium of any of aspects 1 through 2, further including operations, features, circuitry, logic, means, or instructions, or any combination thereof for receiving a request to perform a reinitialization operation for reinitializing the memory device based at least in part on the third indication indicating that the repair operation was prevented.

Aspect 4: The method, apparatus, or non-transitory computer-readable medium of aspect 3, further including operations, features, circuitry, logic, means, or instructions, or any combination thereof for performing the reinitialization operation in response to the request, where performing the reinitialization operation includes broadcasting, to a plurality of latches in the memory device, data stored in a plurality of fuses in the memory device.

Aspect 5: The method, apparatus, or non-transitory computer-readable medium of any of aspects 1 through 4 where the address is associated with a memory bank of the memory device, the first indication of whether the address is valid is stored in a first latch of the memory bank, and the second indication of whether the address is valid is obtained based at least in part on a comparison of the address and values of a plurality of latches of the memory bank.

Aspect 6: The method, apparatus, or non-transitory computer-readable medium of any of aspects 1 through 5 where obtaining the second indication of whether the address is valid comprises comparing a set of bits used to represent the address with values of a plurality of latches that are associated with the address and the method, apparatuses, and non-transitory computer-readable medium, further includes operations, features, circuitry, logic, means, or instructions, or any combination thereof for generating, based at least in part on processing the command, a fourth indication of whether to prevent the repair operation based at least in part on a comparison of the set of bits used to represent the address with the first indication of whether the address is valid.

Aspect 7: The method, apparatus, or non-transitory computer-readable medium of aspect 6, further including operations, features, circuitry, logic, means, or instructions, or any combination thereof for applying, to an AND gate and based at least in part on the generating, the fourth indication of whether to prevent the repair operation and the second indication of whether the address is valid to obtain the third indication.

Aspect 8: The method, apparatus, or non-transitory computer-readable medium of aspect 7 where the third indication of whether the repair operation was performed or prevented is associated with a memory bank of the memory device and the method, apparatuses, and non-transitory computer-readable medium, further includes operations, features, circuitry, logic, means, or instructions, or any combination thereof for applying, to an OR gate, the third indication of whether the repair operation was performed or prevented and a set of indications of whether the repair operation was performed or prevented that is associated with a set of memory banks to obtain a fifth indication of whether any repair operations have been prevented in any memory bank of the memory device.

Aspect 9: The method, apparatus, or non-transitory computer-readable medium of aspect 8, further including operations, features, circuitry, logic, means, or instructions, or any combination thereof for storing the fifth indication of whether any repair operations have been prevented in any memory bank of the memory device; receiving, based at least in part on storing the fifth indication, a request for the fifth indication; and transmitting the fifth indication in response to the request.

Aspect 10: The method, apparatus, or non-transitory computer-readable medium of any of aspects 1 through 9 where the second indication of whether the address is valid indicates that the address is invalid and the method, apparatuses, and non-transitory computer-readable medium, further includes operations, features, circuitry, logic, means, or instructions, or any combination thereof for preventing the repair operation based at least in part on determining to prevent the repair operation from being performed, where the third indication of whether the repair operation was performed or prevented indicates that the repair operation was prevented based at least in part on the repair operation being prevented.

Aspect 11: The method, apparatus, or non-transitory computer-readable medium of any of aspects 1 through 10 where determining whether to perform or prevent the repair operation comprises determining to perform the repair operation based at least in part on the first indication indicating that the address is invalid and the second indication indicating that the address is invalid and the method, apparatuses, and non-transitory computer-readable medium, further includes operations, features, circuitry, logic, means, or instructions, or any combination thereof for performing the repair operation based at least in part on determining to perform the repair operation, where the third indication of whether the repair operation was performed or prevented indicates that the repair operation was performed based at least in part on the repair operation being prevented.

Aspect 12: The method, apparatus, or non-transitory computer-readable medium of any of aspects 1 through 11 where the third indication of whether the repair operation was performed or prevented is stored in a register.

Aspect 13: The method, apparatus, or non-transitory computer-readable medium of any of aspects 1 through 12 where each bit of a set of bits used to represent the address has a same first value.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 14: An apparatus, including: memory; and processor coupled with the memory and configured to cause the apparatus to: store a first indication of whether an address of a memory device is valid; process, after the first indication is stored, a command for accessing the address; obtain, based at least in part on processing the command, a second indication of whether the address is valid; determine whether to perform or prevent a repair operation for repairing the address based at least in part on the first indication and the second indication; and store, based at least in part on the determining, a third indication of whether the repair operation was performed or prevented.

Aspect 15: The apparatus of aspect 14, where the processor is further configured to cause the apparatus to: receive, based at least in part on storing the third indication of whether the repair operation was performed or prevented, a request for the third indication of whether the repair operation was performed or prevented; and transmit, in response to the request, the third indication of whether the repair operation was performed or prevented.

Aspect 16: The apparatus of any of aspects 14 through 15, where the processor is further configured to cause the apparatus to: receive a request to perform a reinitialization operation for reinitializing the memory device based at least in part on the third indication indicating that the repair operation was prevented.

Aspect 17: The apparatus of aspect 16, where the processor is further configured to cause the apparatus to: perform the reinitialization operation in response to the request, where performing the reinitialization operation includes broadcasting, to a plurality of latches in the memory device, data stored in a plurality of fuses in the memory device.

An apparatus is described. The following provides an overview of aspects of the apparatus as described herein:

Aspect 18: A non-transitory, computer-readable medium storing code including instructions that are executable by a processor of an electronic device to cause the electronic device to: store a first indication of whether an address of a memory device is valid; process, after the first indication is stored, a command for accessing the address: obtain, based at least in part on processing the command, a second indication of whether the address is valid; determine whether to perform or prevent a repair operation for repairing the address based at least in part on the first indication and the second indication; and store, based at least in part on the determining, a third indication of whether the repair operation was performed or prevented.

Aspect 19: The non-transitory, computer-readable medium of aspect 18, where the instructions are further executable by the processor to cause the electronic device to: receive, based at least in part on storing the third indication of whether the repair operation was performed or prevented, a request for the third indication of whether the repair operation was performed or prevented; and transmit, in response to the request, the third indication of whether the repair operation was performed or prevented.

Aspect 20: The non-transitory, computer-readable medium of any of aspects 18 through 19, where the instructions are further executable by the processor to cause the electronic device to: receive a request to perform a reinitialization operation for reinitializing the memory device based at least in part on the third indication indicating that the repair operation was prevented.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   storing a first indication of whether an address of a memory device is valid;

processing, after the first indication is stored, a command for accessing the address;

obtaining, based at least in part on processing the command, a second indication of whether the address is valid;

determining whether to perform or prevent a repair operation for repairing the address based at least in part on the first indication and the second indication; and storing, based at least in part on the determining, a third indication of whether the repair operation was performed or prevented.

2. The method of claim 1, further comprising:

receiving, based at least in part on storing the third indication of whether the repair operation was performed or prevented, a request for the third indication of whether the repair operation was performed or prevented; and transmitting, in response to the request, the third indication of whether the repair operation was performed or prevented.

3. The method of claim 1, further comprising:

receiving a request to perform a reinitialization operation for reinitializing the memory device based at least in part on the third indication indicating that the repair operation was prevented.

4. The method of claim 3, further comprising:

performing the reinitialization operation in response to the request, wherein performing the reinitialization operation comprises broadcasting, to a plurality of latches in the memory device, data stored in a plurality of fuses in the memory device.

5. The method of claim 1, wherein:

the address is associated with a memory bank of the memory device, the first indication of whether the address is valid is stored in a first latch of the memory bank, and the second indication of whether the address is valid is obtained based at least in part on a comparison of the address and values of a plurality of latches of the memory bank.

6. The method of claim 1, wherein:

obtaining the second indication of whether the address is valid comprises comparing a set of bits used to represent the address with values of a plurality of latches that are associated with the address, and the method further comprises generating, based at least in part on processing the command, a fourth indication of whether to prevent the repair operation based at least in part on a comparison of the set of bits used to represent the address with the first indication of whether the address is valid.

7. The method of claim 6, further comprising:

applying, to an AND gate and based at least in part on the generating, the fourth indication of whether to prevent the repair operation and the second indication of whether the address is valid to obtain the third indication.

8. The method of claim 7, wherein:

the third indication of whether the repair operation was performed or prevented is associated with a memory bank of the memory device, and the method further comprises applying, to an OR gate, the third indication of whether the repair operation was performed or prevented and a set of indications of whether the repair operation was performed or prevented that is associated with a set of memory banks to obtain a fifth indication of whether any repair operations have been prevented in any memory bank of the memory device.

9. The method of claim 8, further comprising:

storing the fifth indication of whether any repair operations have been prevented in any memory bank of the memory device;

receiving, based at least in part on storing the fifth indication, a request for the fifth indication; and transmitting the fifth indication in response to the request.

10. The method of claim 1, wherein:

the second indication of whether the address is valid indicates that the address is invalid, determining whether to perform or prevent the repair operation comprises determining to prevent the repair operation from being performed based at least in part on the first indication indicating that the address is valid, and the method further comprises preventing the repair operation based at least in part on determining to prevent the repair operation from being performed, wherein the third indication of whether the repair operation was performed or prevented indicates that the repair operation was prevented based at least in part on the repair operation being prevented.

11. The method of claim 1, wherein:

determining whether to perform or prevent the repair operation comprises determining to perform the repair operation based at least in part on the first indication indicating that the address is invalid and the second indication indicating that the address is invalid, and the method further comprises performing the repair operation based at least in part on determining to perform the repair operation, wherein the third indication of whether the repair operation was performed or prevented indicates that the repair operation was performed based at least in part on the repair operation being prevented.

12. The method of claim 1, wherein the third indication of whether the repair operation was performed or prevented is stored in a register.

13. The method of claim 1, wherein each bit of a set of bits used to represent the address has a same first value.

14. An apparatus, comprising:

memory; and processor coupled with the memory and configured to cause the apparatus to:

store a first indication of whether an address of a memory device is valid;

process, after the first indication is stored, a command for accessing the address;

obtain, based at least in part on processing the command, a second indication of whether the address is valid;

determine whether to perform or prevent a repair operation for repairing the address based at least in part on the first indication and the second indication; and store, based at least in part on the determining, a third indication of whether the repair operation was performed or prevented.

15. The apparatus of claim 14, wherein the processor is further configured to cause the apparatus to:

receive, based at least in part on storing the third indication of whether the repair operation was performed or prevented, a request for the third indication of whether the repair operation was performed or prevented; and transmit, in response to the request, the third indication of whether the repair operation was performed or prevented.

16. The apparatus of claim 14, wherein the processor is further configured to cause the apparatus to:
receive a request to perform a reinitialization operation for reinitializing the memory device based at least in part on the third indication indicating that the repair operation was prevented.

17. The apparatus of claim 16, wherein the processor is further configured to cause the apparatus to:
perform the reinitialization operation in response to the request, wherein performing the reinitialization operation comprises broadcasting, to a plurality of latches in the memory device, data stored in a plurality of fuses in the memory device.

18. A non-transitory, computer-readable medium storing code comprising instructions that are executable by a processor of an electronic device to cause the electronic device to:
store a first indication of whether an address of a memory device is valid;
process, after the first indication is stored, a command for accessing the address;
obtain, based at least in part on processing the command, a second indication of whether the address is valid;
determine whether to perform or prevent a repair operation for repairing the address based at least in part on the first indication and the second indication; and
store, based at least in part on the determining, a third indication of whether the repair operation was performed or prevented.

19. The non-transitory, computer-readable medium of claim 18, wherein the instructions are further executable by the processor to cause the electronic device to:
receive, based at least in part on storing the third indication of whether the repair operation was performed or prevented, a request for the third indication of whether the repair operation was performed or prevented; and
transmit, in response to the request, the third indication of whether the repair operation was performed or prevented.

20. The non-transitory, computer-readable medium of claim 18, wherein the instructions are further executable by the processor to cause the electronic device to:
receive a request to perform a reinitialization operation for reinitializing the memory device based at least in part on the third indication indicating that the repair operation was prevented.

* * * * *